(12) United States Patent
Gebremichael et al.

(10) Patent No.: US 10,334,747 B2
(45) Date of Patent: Jun. 25, 2019

(54) CABLE HARNESSING FIXTURE

(71) Applicant: HEWLETT PACKARD ENTERPRISE DEVELOPMENT LP, Houston, TX (US)

(72) Inventors: Dawit Gebremichael, Houston, TX (US); Khalid Kayal, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 233 days.

(21) Appl. No.: 15/380,737

(22) Filed: Dec. 15, 2016

(65) Prior Publication Data

US 2018/0174717 A1    Jun. 21, 2018

(51) Int. Cl.
*B25B 1/20* (2006.01)
*H05K 7/14* (2006.01)
*H01B 13/012* (2006.01)

(52) U.S. Cl.
CPC ..... *H05K 7/1491* (2013.01); *H01B 13/01218* (2013.01)

(58) Field of Classification Search
USPC .............. 269/40, 296, 297, 298, 299, 289 R; 254/10 R, 10 C, 3 C, 93 L
See application file for complete search history.

(56) References Cited

U.S. PATENT DOCUMENTS

| | | | | |
|---|---|---|---|---|
| 1,459,930 A | * | 6/1923 | Riehle | B25H 1/04 144/285 |
| 3,665,986 A | * | 5/1972 | Johnson | B25B 5/142 269/244 |
| 6,360,675 B1 | * | 3/2002 | Jones | A47B 9/00 108/50.02 |
| 7,416,435 B2 | | 8/2008 | Onogi | |
| 9,833,865 B2 | * | 12/2017 | Stone | B23Q 1/035 |
| 9,887,024 B1 | * | 2/2018 | Broderick | H01R 43/00 |
| 2002/0066988 A1 | * | 6/2002 | Couture | B23K 37/0443 269/37 |
| 2006/0266432 A1 | * | 11/2006 | Carter | B25H 1/02 144/286.1 |
| 2008/0126889 A1 | * | 5/2008 | Barnes | G01M 13/02 714/704 |

OTHER PUBLICATIONS

Cami Research Inc., "Wire Harness Testing," (Web Page), CableEye, retrieved online Dec. 15, 2016 at http://www.camiresearch.com/App_Support_Docs/Custom_Harness_Test.html.
Panduit Corporation, "Quick-Build Harness Board System," (Product Bulletin), 2015, 8 pages, available at http://www.mouser.com/pdfdocs/D-WACB28--SA-ENG-QuickBuildHarnessBoard-W.pdf.

* cited by examiner

*Primary Examiner* — Joseph J Hail
*Assistant Examiner* — Shantese L McDonald
(74) *Attorney, Agent, or Firm* — Hewlett Packard Enterprise Patent Department

(57) ABSTRACT

In one example in accordance with the present disclosure, a fixture comprises a first frame horizontally oriented relative to a second frame. The first frame may be coupled to a member adjustable along a first plane. The fixture may also comprise a plurality of lifts, coupled to the member. The plurality of lifts may be adjustable along a second plane that is vertical in relation to the first frame. The fixture may also comprise the second frame vertically oriented relative to the first frame and coupled to the first frame. The second frame may be configured to accept a template for receiving a cable.

20 Claims, 7 Drawing Sheets

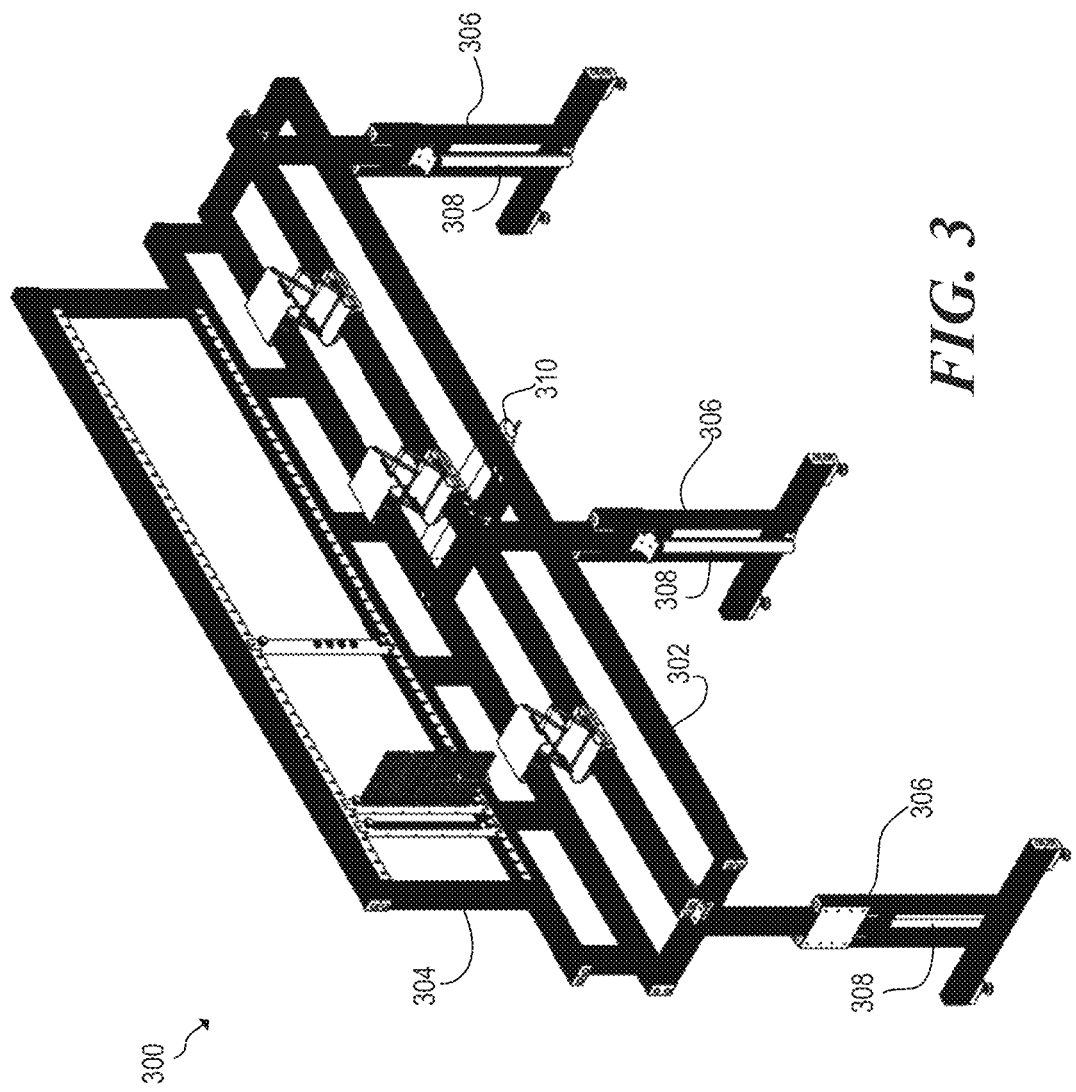

CABLE HARNESSING FIXTURE

BACKGROUND

Cable harnessing is a process by which multiple cables are grouped together for ease of use, safety, etc. The cable harnessing process may include cutting cables to a desired length, stripping the ends of the cable to expose the metal of the cables, fitting the ends with terminal/housings, routing the cables along the server and bounding the cables together.

BRIEF DESCRIPTION OF THE DRAWINGS

The following detailed description references the drawings, wherein:

FIG. 3 is an illustration of an example fixture with adjustable legs according to one aspect of the invention.

DETAILED DESCRIPTION

The present disclosure describes a fixture that allows for the harnessing of cables and cable bundles such as network and direct attach copper (DAC) cables. Specifically, the fixture may be used to emulate the rear of a server rack and allow for the harnessing of cables and cable bundles without having to access the server components and server rack itself. The fixture is used to recreate the distance between the back of the server (where one side of a cable may be plugged into a receptacle on the server) and a harnessing panel that may have receptacles that hold the cable in place. Instead, the cables, cabling instructions and the rack configuration to assemble the cable bundle are used to create the cable harness. The fixture may emulate the server rack in a horizontal plane for the ergonomic utilization as well as ease of use.

The harnessing panel may be placed horizontally on a stand supported by a plurality of lifts which in turn are attached to adjustable bearings that are set on a horizontal extruded aluminum bar. The plurality of lifts may lay on adjustable bearing to accommodate a rack height and/or type of harnessing panel. The lifts can be adjusted vertically to affect the distance between the panel and the bottom of the rack frame. In this way, the fixture may be adjusted in different directions to get the desired dimensions for cable harnessing.

By allowing the harnessing panel to be laid out horizontally on the fixture, the harnessing panel may be more accessible and convenient for the operator, who may sit or stand in a comfortable position to harness the cable. Moreover, the operator may have a clear view of cables and connections by avoiding the congestion of other cables and components that are typically present in a real rack.

Because the harnessing panel is laid out horizontally, the operator may be able to walk to either extremities instead of either stretching arms or bending down. Additionally, the fixture can be adjusted to account for variation of height of the operator and hence the operator has to reach outside of the optimum working height. Further, the operator can adjust the fixture to a comfortable working height by adjusting the entire fixture up or down.

An example cable harnessing fixture may comprise a first frame, horizontally oriented relative to a second frame, coupled to a member adjustable along a first plane. The fixture may comprise a plurality of lifts, coupled to the member, adjustable along a second plane that is vertical in relation to the first frame. The second frame may be vertically oriented relative to the first frame and coupled to the first frame, and may be configured to accept a template for receiving a cable.

Figure 1:
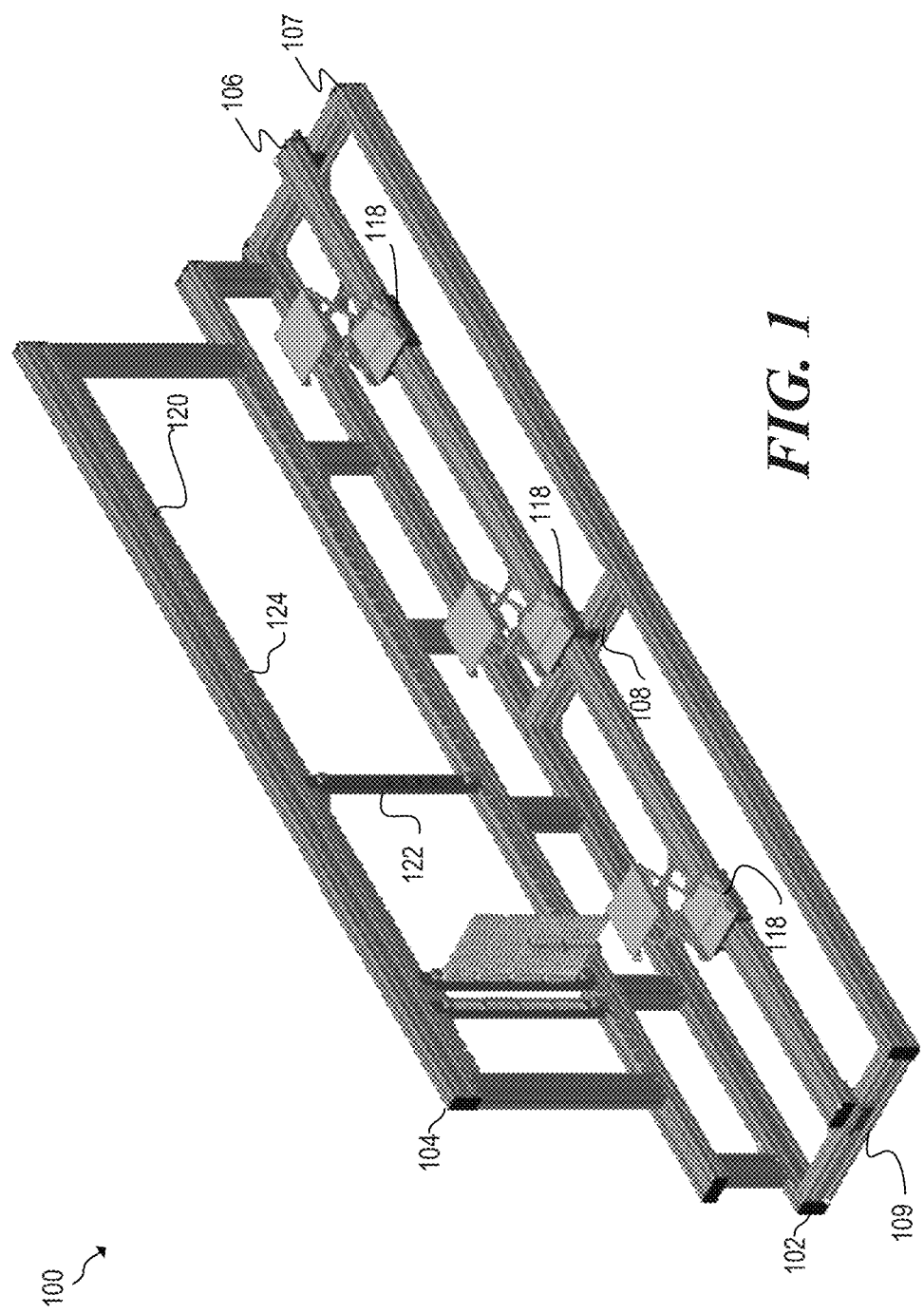
FIG. 1 is an illustration of an example fixture according to one aspect of the invention.

FIG. 1 illustrates an example fixture according to one aspect of the invention. The fixture may also include a frame that accepts different templates emulating different server rack dimensions. For example, there may be a template for 1U server, 2U server, Network switch etc. The templates can be inserted and adjusted upon need and according to the configuration of the real server rack. The templates may also contain connection receptacles (such as the RJ-45 and DAC receptacles used by the real server) in order to provide alignment and orientation for harnessing the cable. The insert templates may also have different spacing of the receptacles in order to emulate the spacing of different server racks. In this manner, the rack frame may accommodate the different types of templates to mimic different server dimensions and types of connections.

The fixture 100 includes a first frame 102 that is horizontally oriented relative to a second frame 104. The first frame 102 may be made from extruded Aluminum bars cut to length and assembled. The second frame 104 may be used to emulate the back of the server rack. The first frame 102 may be coupled to a member 106 that is adjustable along a first plane of the first frame 102. The first plan may simulate the measurement from the back of the actual server to the back of a harnessing panel.

The member 106 may be attached to a first frame at a first edge 107 of the first frame 104 and at a second edge 109 of the first frame 104. The member 106 may be further attached to a supporting bar 108 of the first frame 104. The member may be attached to the first edge 107, second edge 109 and supporting bar 108 by, for example, linear bearings. A break system may also be included where the member 106 is attached to the first edge 107, second edge 109 and supporting bar 108 to hold the member 106 in place. The member may slide across the first edge 107, second edge 109 and supporting bar 108, allowing the member 106 to be adjustable along the first plane.

Figure 2A:
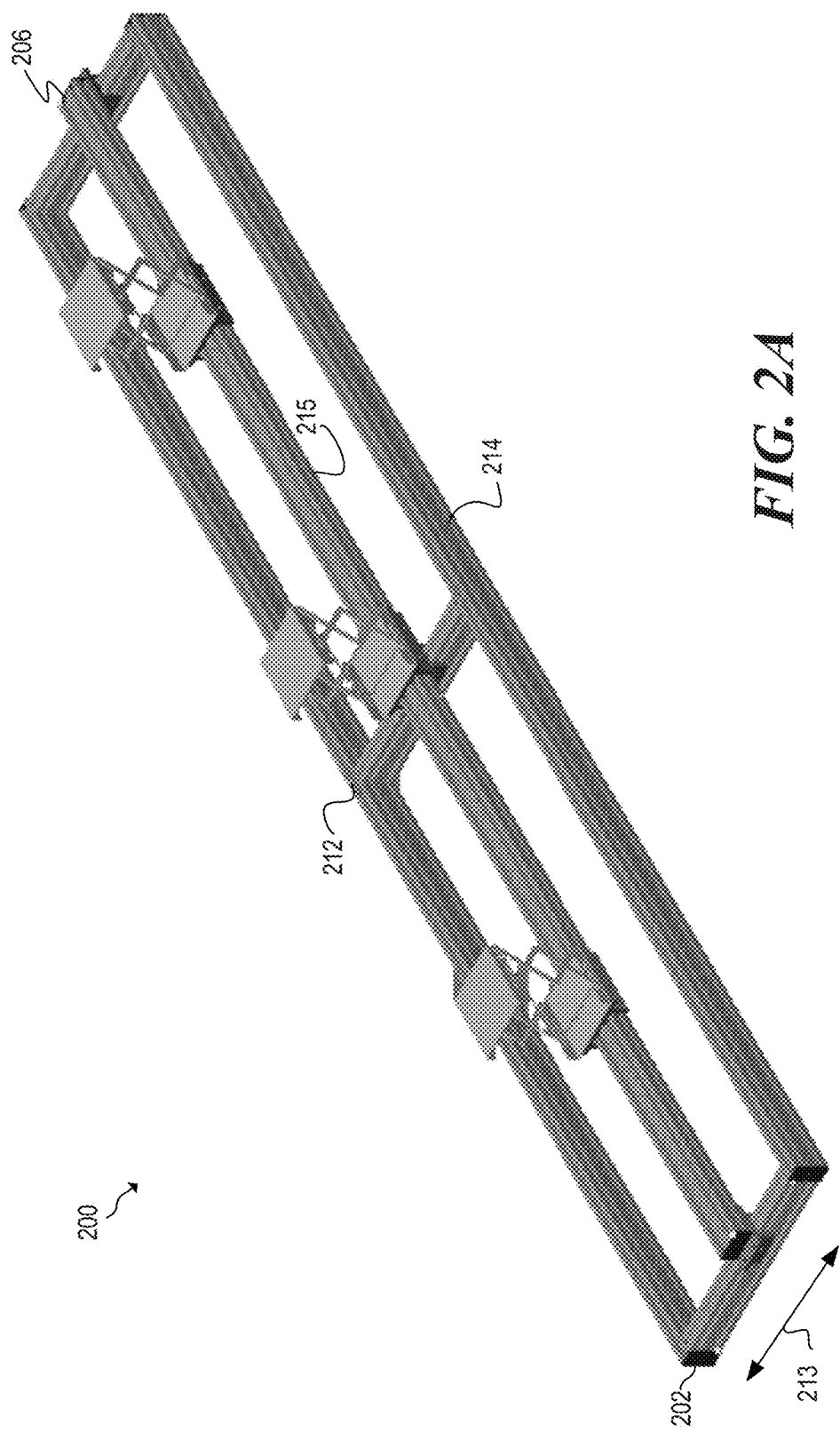
FIG. 2A is an illustration of an example fixture with an adjustable member in a first position according to one aspect of the invention.
Figure 2B:
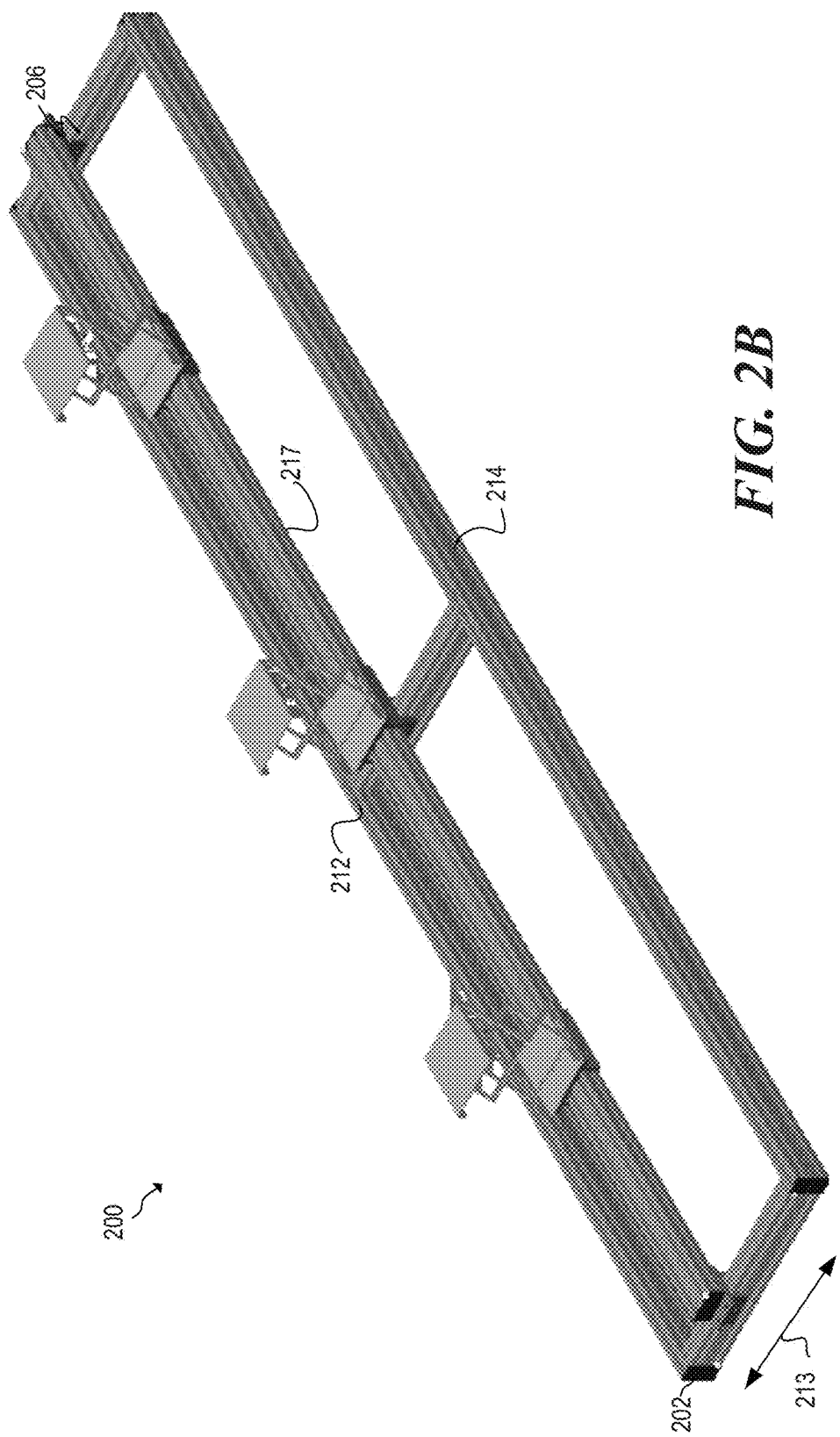
FIG. 2B is an illustration of an example fixture with an adjustable member in a second position according to one aspect of the invention.

Turning briefly to FIGS. 2A-2B, the first plane is illustrated in further detail. FIGS. 2A and 2B depict a fixture 200 with an adjustable member. The fixture 200 that may be similar to fixture 100. Fixture 200 may include a first frame 202 and a member 206. The first frame 202 may have edges, including a third edge 212 and a fourth edge 214. The member 206 may be adjusted along the second plane in between the third edge 212 and a fourth edge 214. Accordingly, the first plane may be similar to a left/right direction horizontally between the third edge 212 and a fourth edge 214. The first plane is represented by arrow 213, depicting the direction that the member 106 is adjustable along, in relation to first edge 108 and second edge 110. FIG. 2A shows the first member 106 in a first position 215 along the first plane and FIG. 2B shows the first member 106 in a second position 217 along the first plane. Although two positions are depicted, first member 106 may be place in any number of positions along the first plane.

Turning again to FIG. 1, a plurality of lifts 118 may be connected to the member 106. The lifts may be attached to the member 106 by, for example, linear bearings. A breaking system may be implemented where the lifts 118 are connected to the member 106, in order to secure the lifts 118 in place. Accordingly, the lifts may be adjustable along the member 106.

Each lift 118 may be adjustable along a second plane. The second plane may be vertical in relation to the first frame. The second plane may simulate the distance between a first receptacle in the server rack, such as, for example, a networking receptacle and the harnessing panel. Although the lifts 118 in FIG. 1 are depicted as scissor lifts, this is for illustrative purposes and other types of lifts may be used. Each lift 118 may be connected to the member 106 by, for example, linear bearings. Although three lifts 118 are illustrated in FIG. 1, more or less than 3 lifts may be connected to the member 106.

Figure 2C:
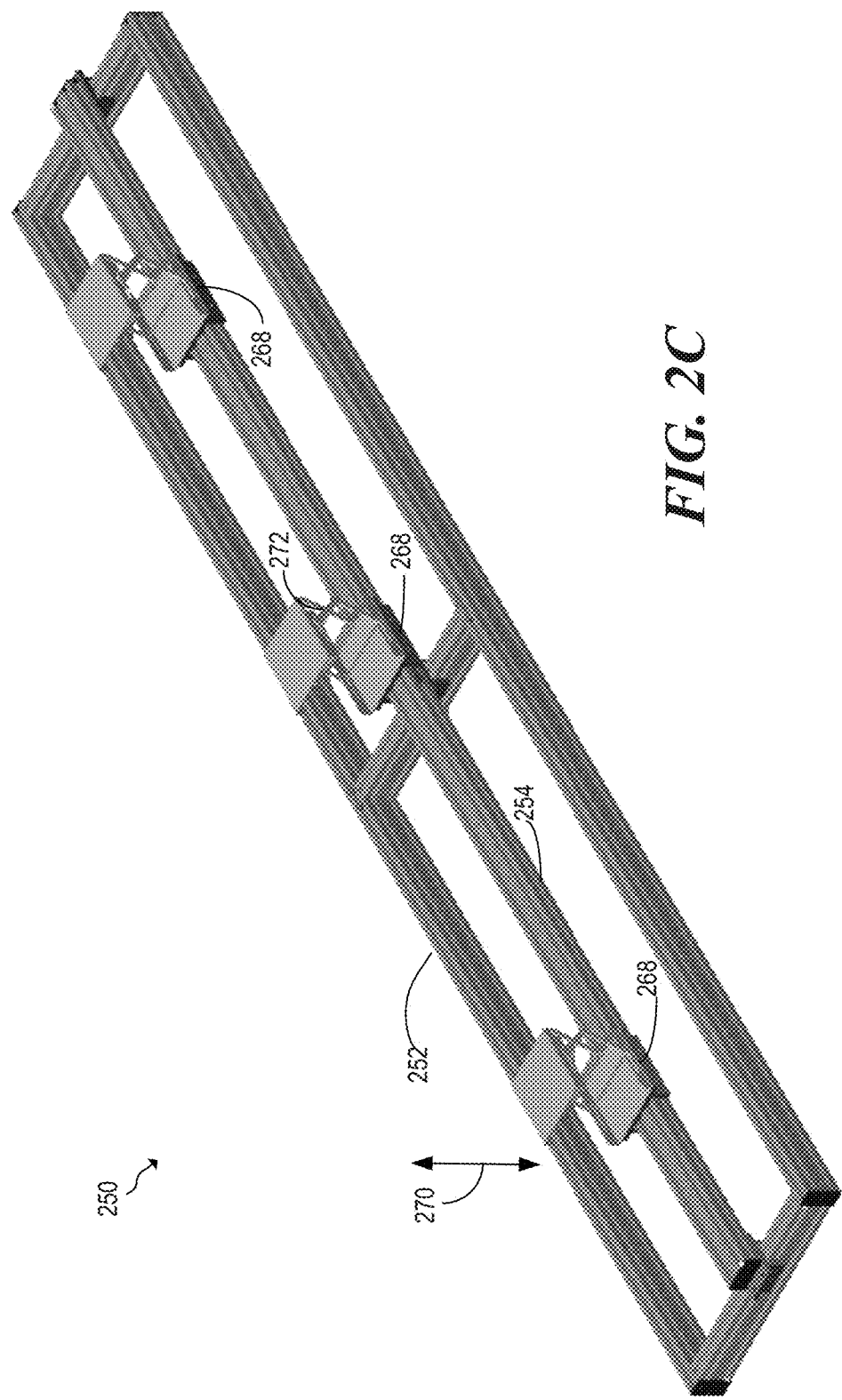
FIG. 2C is an illustration of an example fixture with a plurality of adjustable lifts in a first position according to one aspect of the invention.
Figure 2D:
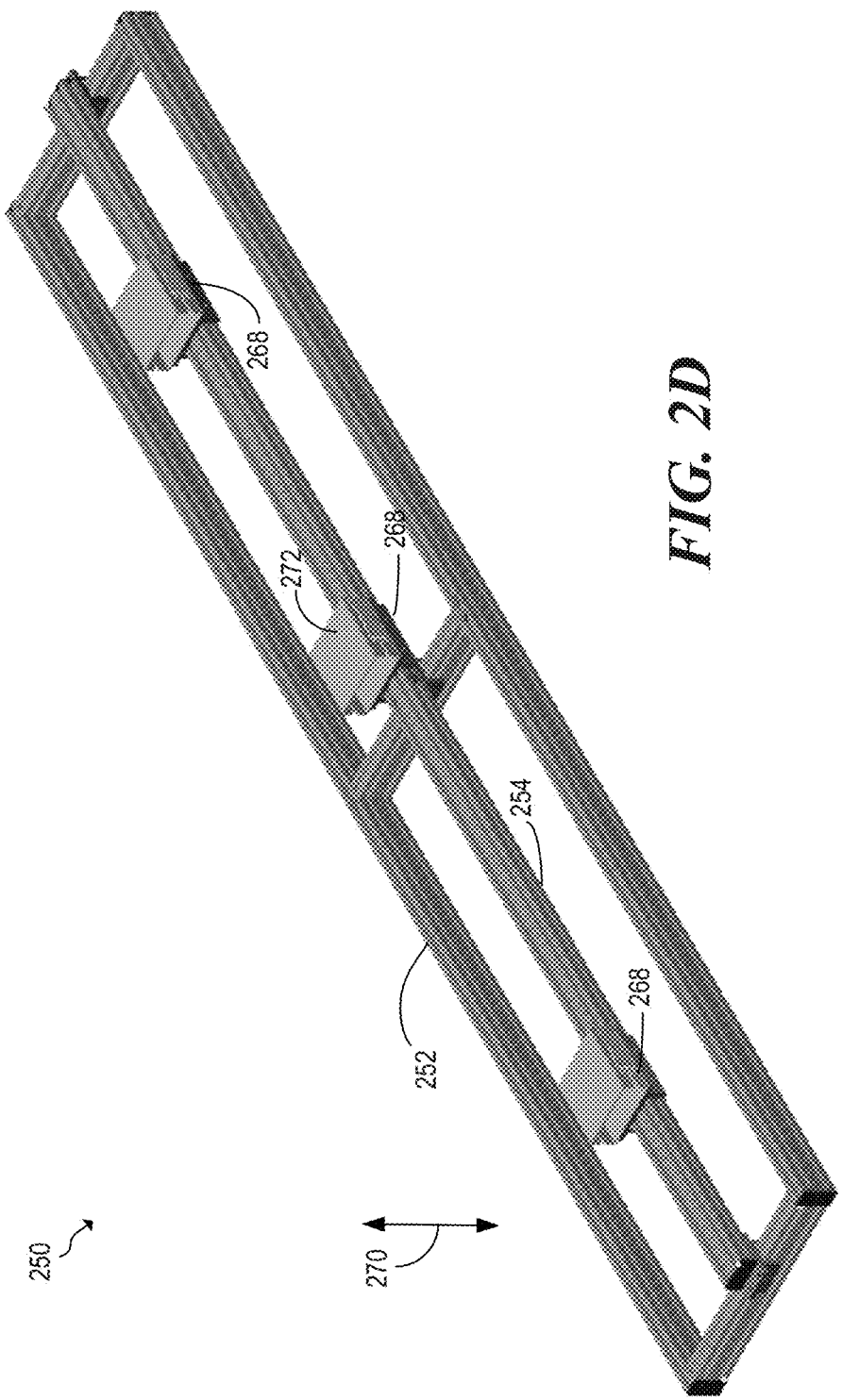
FIG. 2D is an illustration of an example fixture with a plurality of adjustable lifts in a second position according to one aspect of the invention.

Turning briefly to FIGS. 2C-2D, the second plane is illustrated in further detail. FIGS. 2C and 2D depict a fixture 250 with a plurality of lifts. Fixture 250 may be similar to fixtures 100 and 200. Fixture 250 may include a first frame 252 and a member 256. A plurality of lifts 268 may be attached to member 256. The second plane is represented by arrow 270, depicting the direction that the member 256 is adjustable along. FIG. 2C depicts the lifts 268 in a first position 272 along the second plane and FIG. 2D depicts the lifts 268 in a second position 274 along the second plane. Although two positions are depicted, the lifts 268 may be place in any number of positions along the first plane. Although the Figures illustrate the fixture as having a plurality of lifts, in some aspects, the fixture may have a single lift.

Turning again to FIG. 1, the second frame 104 is vertically oriented relative to the first frame and coupled to the first frame. The second frame 104 may include a panel 120 that is configured to accept a plurality of templates 122. The panel may have a plurality of slots 124. The panel 120 and/or the templates 122 may be made out of, for example, sheet metal. Each template 122 may be used to emulate a server that will be placed in the server rack as well as the dimensions of that server. For example, there may be a template for 1U server, 2U server, network switch etc. In some aspects, a single template 122 may be used to emulate more than one server that will be placed in the server rack.

The second frame 104 may have one of a plurality of mechanisms for receiving the templates. For example, each of templates 122 can be inserted into a slot 124 of the second frame 104 and the position of the template 122 in the second frame 104 may be adjusted from slot to slot. Each template 122 may be standardized in order to fit into the slots 124 of the second frame 104. The adjustments may be used to mimic the configuration of a real server rack that the cable harness is being prepared for. The templates 122 may also contain connection receptacles. The templates 122 may also have different spacing of the receptacles in order to emulate the spacing of different server racks. Example connection receptacles may include an RJ-45 receptacle, a DAC receptacles, a power distribution unit (PDU) receptacle, etc. The receptacles may be the same type used by the server the cable harnessing is being prepared for. By using the same receptacles and the same spacing in the templates 122, the fixture may provide proper alignment and orientation for harnessing the cable. Moreover, the templates 122 may be used to emulate other fixtures that may be in the actual server rack. For example, one of the templates 122 may emulate a network switch, with a plurality of network receptacles that may be used for networking in the server rack. The exposed edges of the fixture 100 may be covered in a shroud to cover any exposed pinch points of the fixture 100.

FIG. 3 illustrates an example fixture according to one aspect of the invention. The fixture may be similar to the fixture 100 of FIG. 1, fixture 200 of FIG. 2A-2D, fixture 250 of FIG. 2C-2D etc. The fixture 300 may include a first frame 302 that is oriented horizontally relative to a second frame 304. The second frame may be oriented vertically in relation to the first frame and is connected to the first frame. The fixture 300 may also include a plurality of legs 306. Each leg in the plurality of legs 306 may be connected to the second frame 304 and may be adjustable along a second plane. Each leg in the plurality of legs 306 may be connected to the second frame 304, by, for example, linear bearings. Specifically, the plurality of legs 306 may allow a height of the fixture to be adjusted along the second plane. The second plane may be vertical in relation to the first frame 302. The second plane may be similar to the second plane discussed above in reference to FIGS. 2C-2D. For example, at least one of legs in the plurality of adjustable legs 306 may be connected to a hydraulic jack cylinder 308 for moving the legs 306 along the second plane. Although FIG. 3 depicts a hydraulic jack cylinder 308 connected to each leg 306, in some aspects each leg 306 may not be connected to a hydraulic jack cylinder 308. A Hydraulic crank 310 may be connected may be used to adjust the height fixture by controlling the movement of the hydraulic jack cylinders 308, and thus the location of the plurality of legs 306, across the second plane. A breaking system may also be implemented into the plurality of legs 306 to secure the legs in place and maintain the position of the fixture.

An operator using the fixture to harness cables may use the hydraulic crank 310 to adjust the height of the fixture 300 to the operator's specifications. In this manner, the operator may be able to sit in a comfortable position while using the fixture for a prolonged period of time.

Figure 4:
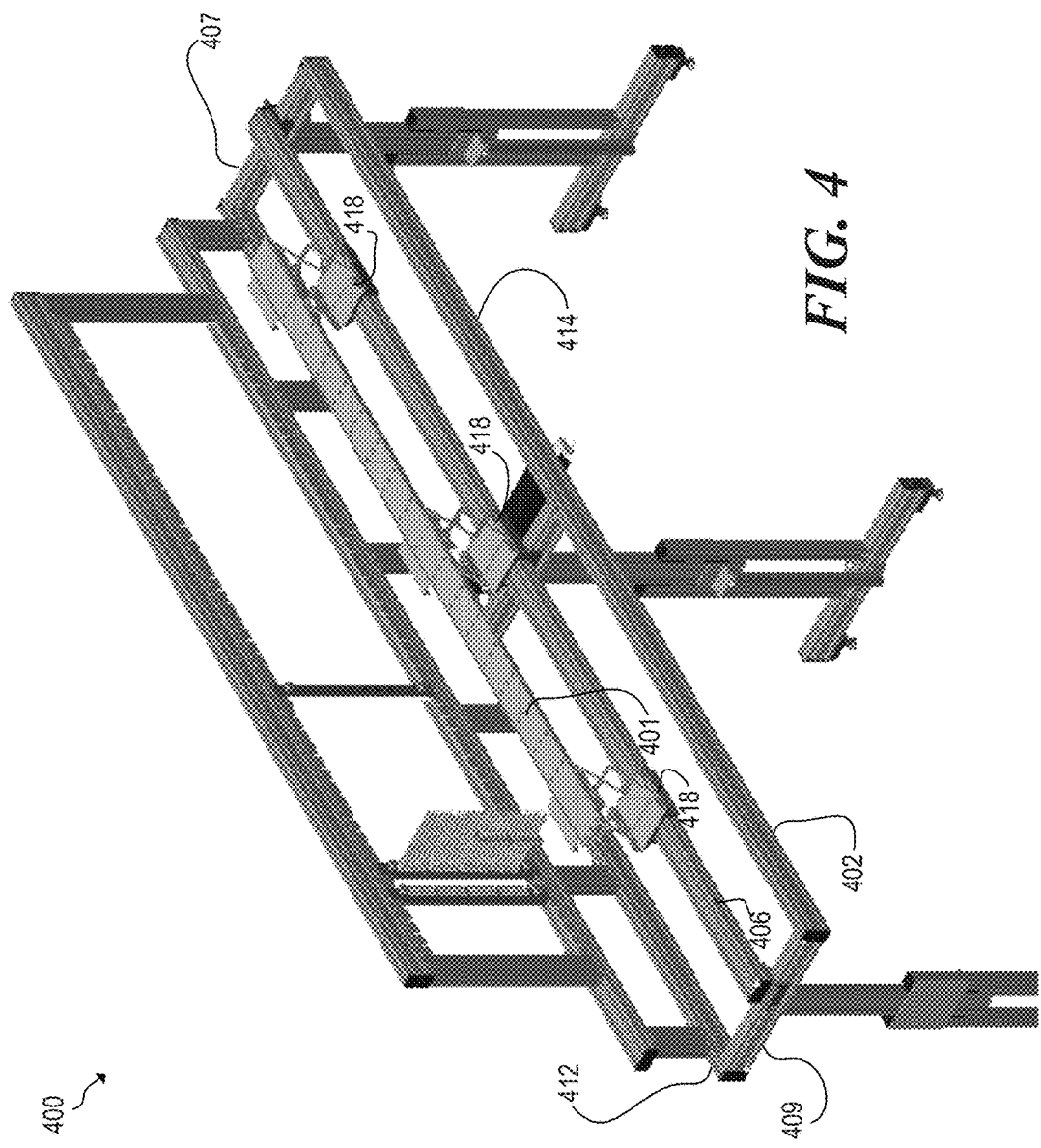
FIG. 4 is an illustration of an example fixture with a cable harnessing panel according to one aspect of the invention.

FIG. 4 illustrates an example fixture according to one aspect of the invention. FIG. 4 depicts a fixture 400 that may be similar to the fixtures 100 and 300 illustrated in FIGS. 1 and 3, respectively. A cable harnessing panel 401 may be placed on the fixture 400 and may be used for harnessing the cables. Specifically, the cables may be placed on the cable harnessing panel. The harnessing panel may be similar to a harnessing panel used in a cabinet where a server rack may be installed. The harnessing panel may have indentations where a cable harness can be attached to the harnessing pane. The panel 401 used with the fixture may not be the same panel as that used in the installation, but may have the indentations in the same or similar areas. Accordingly, the cables may be harnessed at the proper spot and then attached to the cable harnessing panel at the server rack installation.

Specifically, the cable harnessing panel may be placed on lifts 418. The lifts 418 may be attached to an adjustable member 406 of a first frame 402 of the fixture 400. The lifts may be adjusted along the member 406 in order to provide adequate support for the harnessing panel. The lifts may be adjusted along a second plane that is vertical in relation to the first frame. In this manner, the fixture 400 may mimic the dimensions of a server rack and the indentations in the harnessing panel may emulate where the indentations will be in a harnessing panel used in the installed of the server rack in a server cabinet.

The adjustable member 406 may be adjustable along a first plane of the first frame 402. The adjustability along the first plane may allow the cable harnessing panel to be placed with respect to the second frame 404 and allow for control of the cable harness branch length in a uniform manner. The first frame 402 may have a plurality of edges including a first edge 407, a second edge 409, a third edge 412 and a fourth edge 414. Indentations and/or other markers may be placed on at least one of the edges to indicate certain cable lengths. This may be done, for example, using tape, a lead screw, etc.

In some aspects, a separate harnessing panel may be used for power cables. In these aspects, a Power Distribution Unit holder may be attached to the harnessing panel. The bracket cable may have receptacles for power cabling.

The foregoing disclosure describes a number of example cable harnessing fixtures. For purposes of explanation, certain examples are described with reference to the components illustrated in FIGS. 1-4. The examples illustrated in FIGS. 1-4 are examples and are not intended to be limiting. Additional or fewer components and elements may be used or may vary without departing from the scope of the disclosed examples. Moreover, the functionality of the illustrated components may overlap, however, and may be present in a fewer or greater number of elements and components. Further, the disclosed examples may be implemented in various environments and are not limited to the illustrated examples. Thus, the present disclosure merely sets forth possible examples of implementations, and many variations and modifications may be made to the described examples.

The invention claimed is:

1. A fixture comprising:
    a first frame, horizontally oriented relative to a second frame, coupled to a member adjustable along a first plane;
    a cable harnessing panel;
    a plurality of lifts, coupled to the member, adjustable along a second plane that is vertical in relation to the first frame, the plurality of lifts configured to accept the cable harnessing panel; and
    the second frame, vertically oriented relative to the first frame and coupled to the first frame, the second frame configured to accept a template for receiving a cable.

2. The fixture of claim 1 wherein the first frame comprises a first stationary bar and a second stationary bar and the member coupled to the first frame is adjustable to move between the first stationary bar and the second stationary bar.

3. The fixture of claim 2 wherein the first stationary bar is attached to the first frame with a linear bearing.

4. The fixture of claim 1 wherein the template is a power port template comprising a second port for receiving a power cable.

5. The fixture of claim 1 wherein the plurality of lifts are adjustable across a third plane relative to the member coupled to the first frame.

6. The fixture of claim 1 wherein the second frame includes a slotted mechanism for accepting the template.

7. The fixture of claim 1 wherein the template is a network port template and comprises a first port to receive a network cable.

8. The fixture of claim 1 wherein the second frame corresponds to dimensions of a server rack.

9. The fixture of claim 1 comprising:
    a plurality of legs, each of the plurality of legs coupled to the first frame.

10. The fixture of claim 9 wherein plurality of legs are adjustable along the second plane, the adjustment corresponds to a height of the fixture along the second plane.

11. The fixture of claim 10 wherein the plurality of adjustable legs are coupled to a hydraulic cylinder for adjustment along the second plane.

12. A fixture for cable harnessing comprising:
    a first frame, horizontally oriented relative to a second frame, the first frame coupled to a member adjustable along a first plane of the first frame;
    a cable harnessing panel;
    a plurality of lifts, coupled to the member, adjustable along a second plane that is vertical in relation to the first frame, the plurality of lifts configured to accept the cable harnessing panel; and
    the second frame, vertically oriented relative to the first frame, coupled to the first frame and configured to accept a template having a first receptacle for receiving a cable, the first receptacle corresponding to a second receptacle on the cable harnessing panel.

13. The fixture of claim 12 wherein the second frame corresponds to dimensions of a server rack.

14. The fixture of claim 12 wherein a distance between the cable harnessing panel and the second frame emulates a second distance between the server rack and a second cable harnessing panel used in an installation of the server rack.

15. The fixture of claim 12 wherein the template is a network switch template corresponding to a network switch included in the installation of the server rack.

16. The fixture of claim 12 comprising:
    a plurality of legs, each of the plurality of legs coupled to the first frame.

17. The fixture of claim 16 wherein the plurality of adjustable legs are coupled to a hydraulic cylinder for adjustment along the second plane.

18. The fixture of claim 17 comprising: a hydraulic crank for controlling the hydraulic cylinder to move the legs along the second plane.

19. The fixture of claim 12 wherein the second frame includes a slotted mechanism for receiving the template.

20. The fixture of claim 12 wherein the plurality of lifts are coupled to the member with a linear bearing.

* * * * *